US006684169B2

(12) United States Patent
Masella, Jr. et al.

(10) Patent No.: US 6,684,169 B2
(45) Date of Patent: Jan. 27, 2004

(54) FACILITATING COMPARISONS BETWEEN SIMULATED AND ACTUAL BEHAVIOR OF ELECTRONIC DEVICES

(75) Inventors: Anthony Masella, Jr., Littleton, MA (US); Bruce A. Webster, Norton, MA (US)

(73) Assignee: Teradyne, Inc., Boston, MA (US)

( * ) Notice: Subject to any disclaimer, the term of this patent is extended or adjusted under 35 U.S.C. 154(b) by 61 days.

(21) Appl. No.: 09/896,327

(22) Filed: Jun. 29, 2001

(65) Prior Publication Data

US 2003/0004663 A1 Jan. 2, 2003

(51) Int. Cl.[7] .................................................. G06F 3/00
(52) U.S. Cl. .............................. 702/66; 702/68; 702/69; 702/73; 702/74
(58) Field of Search ............................... 702/66, 68, 69, 702/73, 74, 108, 117, 118, 121–124, 126, 189; 345/501, 970, 967, 965, 961; 703/14, 15, 18, 26; 714/26, 30, 43, 45

(56) References Cited

U.S. PATENT DOCUMENTS

| 5,371,851 A | * 12/1994 | Pieper et al. ................ 395/164 |
| 5,838,948 A | * 11/1998 | Bunza ......................... 395/500 |
| 6,236,956 B1 | * 5/2001 | Manhooth et al. ............ 703/14 |
| 6,263,301 B1 | * 7/2001 | Cox et al. .................... 703/14 |

FOREIGN PATENT DOCUMENTS

WO    WO 00/45188    8/2000    .......... G01R/31/28

OTHER PUBLICATIONS

Val Garuts and Jim Tallman, On–board digital processing refines scope measurements, Mar. 13, 1980, Tektronix Inc., Beaverton, Ore, pp. 105–114.*

Image Solutions V7.0, "VX Software" Chapter 1: Simulation for Test Engineers; Chapter 5: DataScope, Teradyne, Inc.

Web pages captured Aug. 7, 2001 from www.ims.com and www.virtualtest.com/aboutvt.html, ©1999–2001 Integrated Measurement Systems™, Inc. 9525 S.W. Gemini Drive, Beaverton, OR. 97008 USA.

* cited by examiner

Primary Examiner—Marc S. Hoff
Assistant Examiner—Felix Suarez
(74) Attorney, Agent, or Firm—Bruce Rubenstein

(57) ABSTRACT

A system for analyzing the behavior of electronic devices includes a first database for storing simulation values and a second database for storing actual waveform values. The system further includes software for aligning the values stored in the first and second databases, so that simulated and actual values can be readily compared. Analysis tools are included for examining similarities and differences between simulated and actual behavior.

24 Claims, 6 Drawing Sheets

FACILITATING COMPARISONS BETWEEN SIMULATED AND ACTUAL BEHAVIOR OF ELECTRONIC DEVICES

FIELD OF THE INVENTION

This invention relates generally to simulating and/or testing electronic devices, and, more particularly, to facilitating comparisons between the behavior of a device predicted by a simulation and the behavior of a corresponding physical device exercised on a tester.

BACKGROUND OF THE INVENTION

When a designer develops a new electronic device, the designer generally concurrently develops a software model for the new device. The software model simulates the behavior of a physical device by producing output data in response to input data analogously to the way in which the physical device produces output signals in response to input signals.

A software model, once developed, can be made available to aid in developing a test program. A test program is a software program that runs on a tester for testing actual, physical devices. A conventional process for developing a test program is shown generally in FIG. 1. An engineer acquires the device model (step 110) and generates "test patterns," i.e., sequences of data that correspond to input signals that are to be applied to inputs of an actual device under test (DUT) during operation of the test program on a tester (step 112). The engineer applies the test patterns to the device model. In response, the device model generates response data (step 114). Using the response data, as well as knowledge about the device and about the target tester, the engineer generates "expect data," i.e., expected values of output signals from DUT in response to the test patterns during the execution of the test program.

To implement a test program for use with a particular target tester, a test engineer translates the simulated test patterns and expect data into software instructions that are compatible with the target tester (step 116). The test engineer stores the software instructions in the test program (step 118) and debugs the test program by running it on the tester to test actual, physical devices (step 120). The test engineer may alternatively debug the test program in a software environment that simulates both the tester and the device under test. Under control of the test program, the tester (or simulated tester) applies stimuli to inputs of a DUT (or simulated DUT), and captures responses from outputs of the DUT (or simulated DUT). The tester compares the captured responses with expect data stored in the test program. If the responses match the expect data, the test program passes. Otherwise, the test program fails.

Test programs commonly fail when first run, even when testing known-good devices. The reasons for this are varied, and include inaccurate data used to generate device models, failure to account for normal semiconductor process variations, and other sources. To address these problems, test engineers customarily modify the test programs (step 122), test the changes, and repeat as needed to yield more reliable test programs. Eventually, the test program passes and is deployed to a testing facility for performing volume production testing.

Test engineers generally develop and debug test programs with only limited access to testers and with only limited numbers of actual devices. Consequently, problems with test programs often do not arise until after the test programs have been deployed. The personnel at the testing facilities generally lack expertise in test program development and in the test programs for specific devices. When a test program fails while testing a device that is believed to be good, the testing facility may halt production until the source of the problem is identified and the problem is solved. The testing facility generally falls back on the test engineer responsible for the test program to receive assistance. Messages from the testing facility usually take the form of emails, faxes, or telephone calls, which describe the nature of the failure. The test engineer receives the messages and prepares responses for the testing facility. In preparing responses, the test engineer may consult with device designers and examine simulations of the device. The test engineer's responses generally take the form of emails or faxes, which includes suggestions for modifying the test program. They may also include revised software, transmitted electronically or via a physical storage medium.

This method of troubleshooting test programs involves several drawbacks. For example, the test development facility may be physically distant from the testing facility, making direct communication difficult. Different time zones, languages, and areas of expertise can significantly impair the ability to develop speedy solutions to test program failures. It often happens that a test engineer flies to Asia on a lengthy support mission, only to discover that the problem is one that could have been solved easily without the trip if better information had been available. Perhaps more significantly, test program failures can bring a production line to a complete halt until the failures are resolved. The opportunity cost of halting a production line can quickly rise to an excessive level.

SUMMARY OF THE INVENTION

With the foregoing background in mind, it is an object of the invention to facilitate understanding of the behavior of an electronic device exercised by an automatic test system.

To achieve the foregoing object, as well as other objectives and advantages, a system for examining the behavior a device exercised by an automatic test system includes a first collection of data for storing simulation values and a second collection of data for storing actual waveform values. The simulation values include test patterns representing inputs of a device model and response data representing outputs of the device model. They may also include expect data representing expected values of the response data. The actual waveform values include sampled inputs and/or outputs of an actual device under test (DUT) acquired using an electronic test system. When a tester exercises the DUT with test patterns that correspond to the test patterns stored in the first collection of data, the DUT generates output that can be compared directly with the response and/or expect data stored in the first collection of data. Software is included for aligning the data stored in the first and second collections of data, so that simulated and actual values can be readily compared. Analysis tools are included for examining similarities and differences between simulated and actual behavior. These may include a graphical display for visually representing simulated and actual values. The graphical display enables a user of the system to identify instances in which the actual behavior of a DUT deviates from the simulated behavior.

BRIEF DESCRIPTION OF THE DRAWINGS

Additional objects, advantages, and novel features of the invention will become apparent from a consideration of the ensuing description and drawings, in which—

DETAILED DESCRIPTION OF THE PREFERRED EMBODIMENT

Overview

Figure 1:
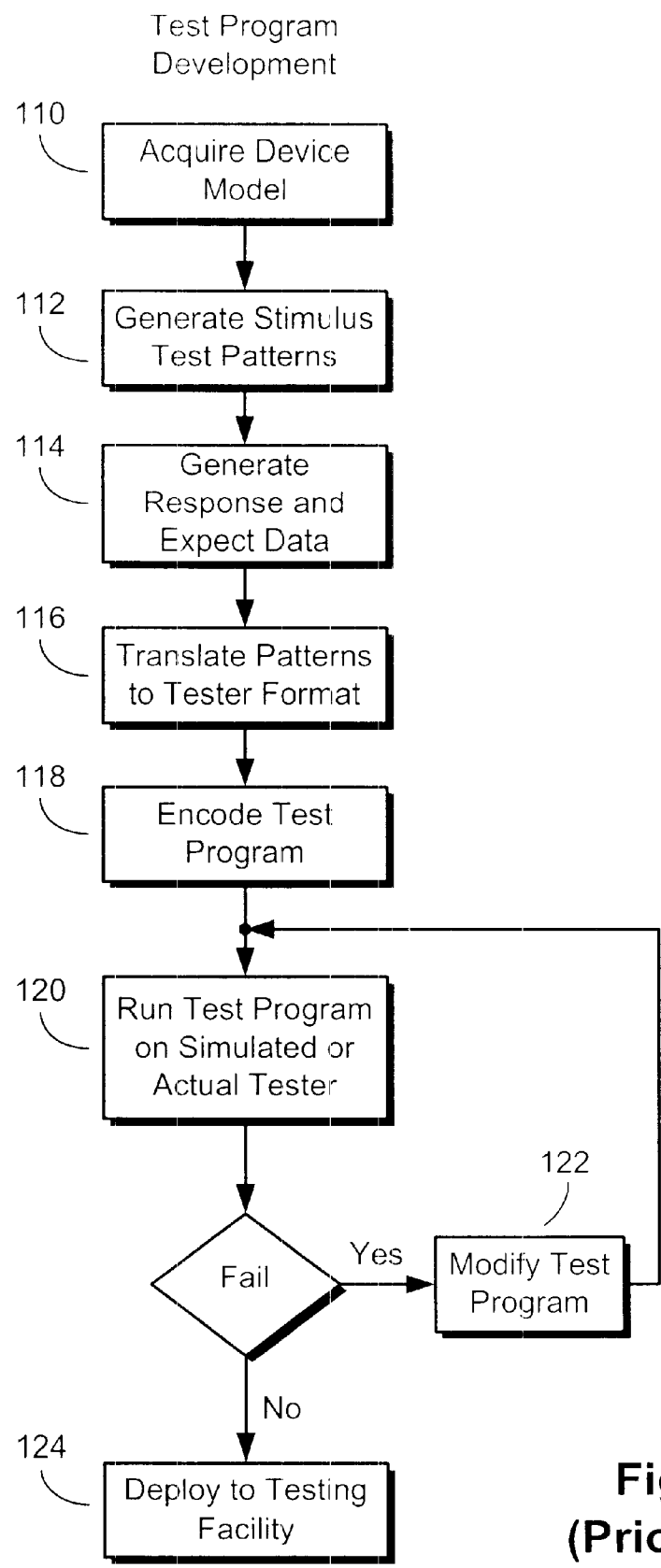
FIG. 1 is a flowchart that shows the conventional process for developing a test program.
Figure 2:
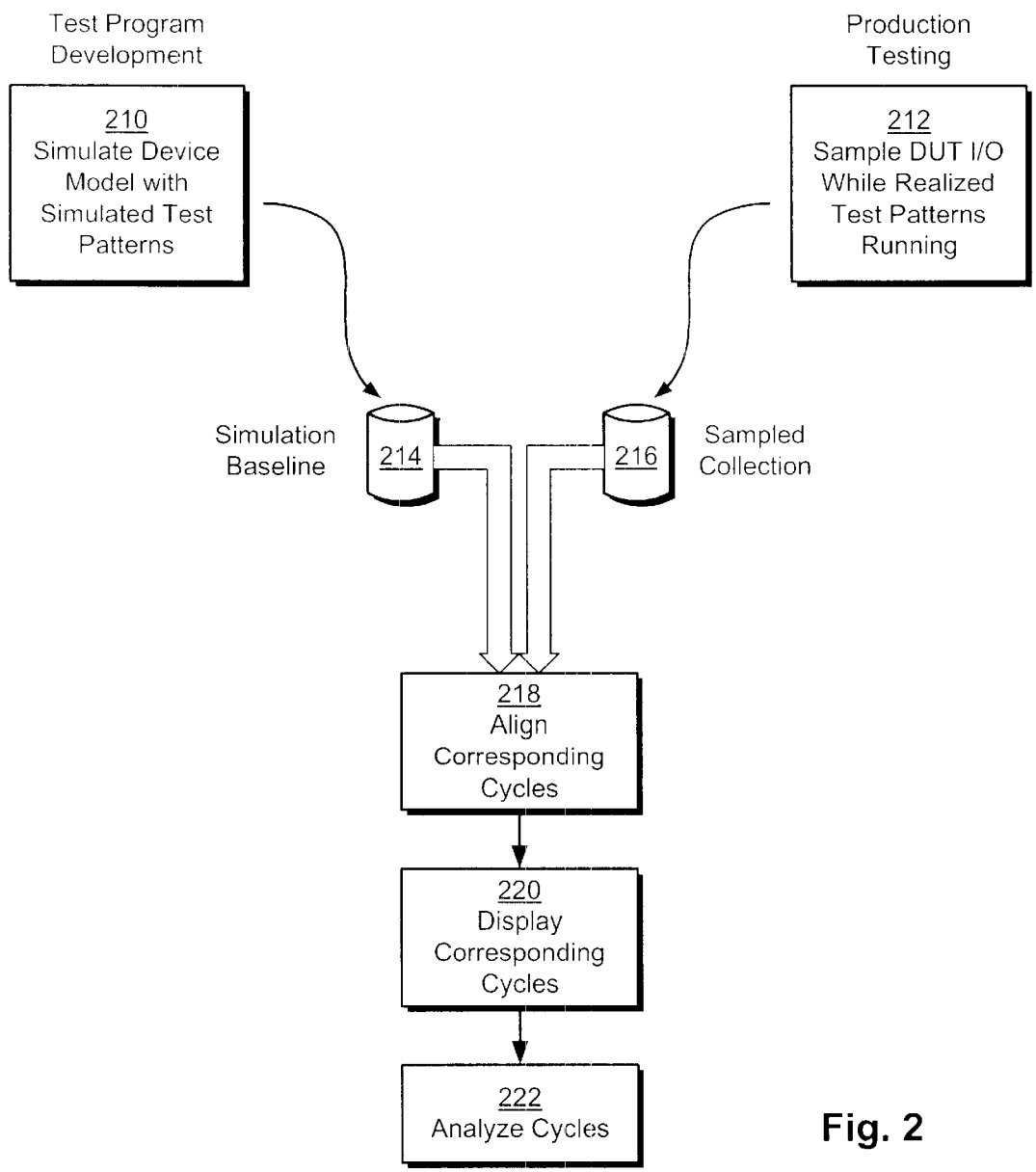
FIG. 2 is a flowchart illustrating an overview of a process for troubleshooting a test program failure according to the invention.

FIG. 2 is a high-level flowchart of a process according to an embodiment of the invention for troubleshooting a test program. At step 210, the device is simulated using a device model that represents the type of device that will be the subject of the test program. The simulator applies test patterns to the device model, which in turn produces response data. From the functional description (or functional model), expect data are also produced. The test patterns, response data, and expect data are stored in a first collection of data 214, hereinafter called the "simulation baseline."

At step 212, an automatic test system is made to sample actual waveforms from physical nodes of a device under test (DUT) of the type represented by the device model. The tester samples nodes of the DUT and stores the sampled values in a second collection of data 216, hereinafter called the "sampled collection." To sample the waveforms, the tester is made to produce test stimuli that correspond to physical realizations of some or all of the test patterns applied to the device model during the simulation. For example, if a test pattern specifies that a particular input of the device model is to go HIGH at 20 ns into a particular test cycle, the tester can be made to supply an actual input signal to the corresponding pin of the DUT that goes high at 20 ns into the corresponding physical test cycle. The tester testing a DUT is thus made to realize some or all of the simulation in an actual testing environment.

For each cycle of actual waveform data stored in the sampled collection 216, a corresponding cycle of simulated data can be found in the simulation baseline 214. At step 218, cycles of actual data stored in the sampled collection 216 are aligned with corresponding cycles of simulated data in the simulation baseline 214. Aligning the cycles enables simulated test events to be compared directly with corresponding actual test events that occur on an actual tester.

At step 220, aligned data from the simulation baseline 214 and the sampled collection 216 are rendered on a graphical display. The data are preferably rendered as waveforms, i.e., continuous signals that vary as a function of time. Displaying simulated and actual waveforms together allows a user to visually inspect similarities and differences between the two types of waveforms, and to drawn conclusions about how the test program and/or device model may be operating.

Analysis tools are preferably included to aid the user in finding discrepancies between the simulated and actual waveform data (step 222). The analysis tools preferably include a "Waveform Scan and Compare" feature for scanning through the simulation baseline 214 and the sampled collection 216 to identify instances in which the simulated and actual waveforms differ by more than a predetermined limit, and then reporting these instances.

Simulation Baseline

In the preferred embodiment, the software environment that simulates the device under test also emulates the target tester and any external hardware needed to facilitate testing. The software environment preferably executes the test program itself, rather than applying idealized test patterns that represent those included with the test program. This type of simulation yields more realistic results than one that simulates the device only, because it captures the characteristics of the test system and the interaction between the test system and the device under test. It also allows the test program to be developed on a computer workstation without tester hardware. This relieves the test developer of the need to have access to tester hardware. It also enables the test developer to largely complete and debug a test program for a new device prior to the arrival of the first devices from the fabrication facility.

One suitable software environment for both simulating the device and emulating the tester and any external hardware is the VX Simulation Model ("VX") produced by Teradyne, Inc., of Boston, Mass. VX connects a tester's software environment with electronic design automation (EDA) tools to allow test programs to be executed using simulations of the tester and the DUT.

Test developers have traditionally used VX to assist in developing test programs. VX includes a feature, which can be invoked by a user prior to running a simulation, for storing a record of all stimuli, responses, and expect data as they are produced during a simulation of a program testing the DUT. According to the preferred embodiment of the invention, this record of simulated test data is used to create the simulation baseline 214. VX can therefore store the record of simulated test data with little or no additional effort on the part of the user.

Figure 3:
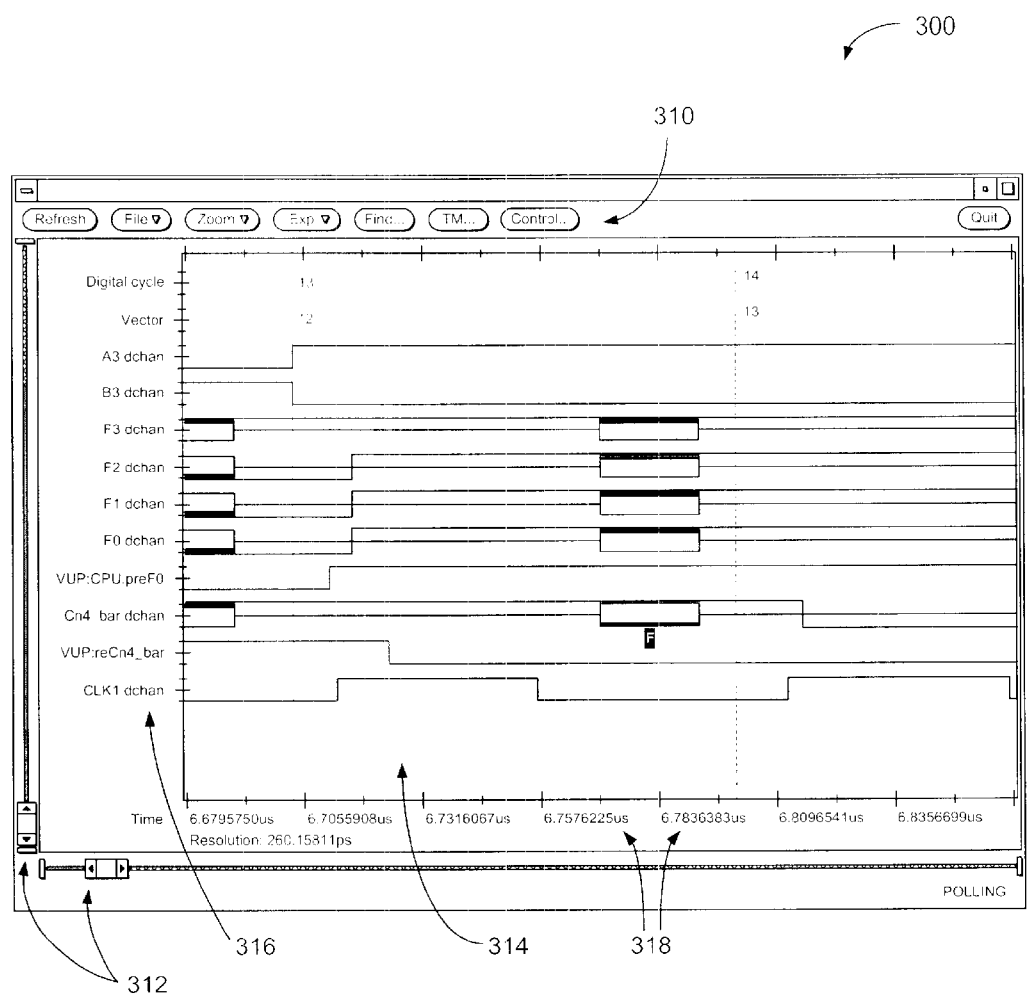
FIG. 3 depicts a screen shot for displaying simulated waveforms of a device model responding to test patterns, according to the prior art.

VX includes a program called "DataScope" for displaying simulated data as waveforms, similar to the way that an oscilloscope displays physical electronic signals as waveforms. Waveforms displayed in DataScope correspond to simulated data from different nodes of the device. FIG. 3 is a drawing of a typical DataScope screen 300. The DataScope screen 300 includes controls that are commonly found in programs having a graphical user interface, such as control buttons 310 and scroll bars 312. Within DataScope, the control buttons enable a user to operate a host of features, such as features for adding and deleting waveforms from the display, searching for failures, changing the time scale, and zeroing in on a particular event in time. The vertical scroll bar enables a user to display waveforms that are off screen, and the horizontal scroll bar enables a user to change the time range over which waveforms are displayed.

A trace region 314 within the screen 300 displays the selected waveforms. To the left of the trace region, waveform labels 316 indicate the node names of the respective waveforms. Below the trace region 314, time markers 318 identify the simulated time for which the waveforms are displayed. Waveforms are displayed for different nodes at corresponding instants of simulated time. The common time scale allows the user to explore cause-effect relationships among the different simulated waveforms. The simulated time shown by the time markers 318 corresponds to actual instants in time during the operation of the test program on an actual tester. The events that occur among the displayed waveforms therefore correspond to test events occurring on an actual device under test during the operation of the test program.

The trace region 314 displays stimuli, expect data, and responses. Stimuli appear as single waveforms (e.g., "A3 dchan" and "B3 dchan"). Expect data appear as boxes with an additional line at either the top or the bottom of the box to respectively indicate an "expect-HI" or an "expect-LO." Responses appear around the expect data. For example, "F3dchan" has a response that is HI throughout the displayed time range. It has expect data that is HI (additional line at the top of the box) a first time at the beginning of the displayed time range and a second time just after the middle of the displayed time region. Note that the simulation "passes" for F3dchan during this time range, because the response data matches the expect data during the relevant intervals (within the time spans represented by the respective boxes). In contrast, the node "Cn4_bar dchan" fails, as indicated with the letter "F," because the response is HI when the expect value is low, within the second displayed box. Although FIG. 3 appears in black-and-white, the actual screen represented by FIG. 3 runs on a color display, for which stimuli, expect data, and responses each have a distinctive color for easy recognition.

DataScope has previously been used for displaying simulation data only. In accordance with the invention, however, DataScope is enhanced to also display actual waveforms acquired by an automatic test system exercising an actual device under test.

Sampled Collection

When a test program is deployed at a testing facility and a believed-good device inappropriately fails the test program, data can be collected from the failing device for comparison with the simulation baseline 214 within DataScope. To allow for accurate comparison, portions of the simulation for which comparison is sought should be realized on the actual tester. In theory, this means running the actual test program on the device under test and digitizing the device I/O as the test program proceeds. In actuality, however, testers generally lack the hardware needed for accurately digitizing of each pin of the device under test in real time.

Figure 4A:
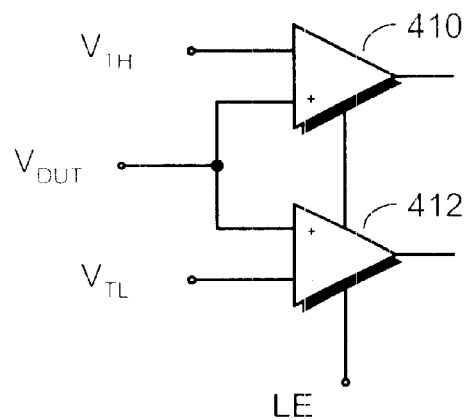
FIGS. 4A–4C respectively show a detector circuit of an automatic test system for sampling actual waveforms, a graph showing a method of sampling using an "edge" method with the detector circuit of FIG. 4A, and a graph showing a method of sampling using a "level" method with the detector circuit of FIG. 4A.

Although testers generally do not include high-speed samplers for each pin of the DUT, they do generally include window detectors for each pin. The window detectors identify the state of a signal in real time as either a HI, a LO, or a BETWEEN. FIG. 4A shows a conventional window detector, which is typical of that provided for each pin of a tester. The window detector includes two comparators 410 and 412. The upper comparator 410 receives a signal $V_{DUT}$ from a pin of the DUT and compares it with a HI threshold voltage, $V_{TH}$. The output of the comparator 410 assumes a HI or a LO state, depending upon whether $V_{DUT}$ is greater than or less than $V_{TH}$. The lower comparator 412 also receives $V_{DUT}$, and compares it with a low threshold voltage, $V_{TL}$. The output of the comparator 412 is either HI or LO depending upon whether $V_{DUT}$ is greater than or less than $V_{TL}$. Both comparators 410 and 412 receive a latch enable signal (LE), which can be activated once per test cycle. Upon activation, the LE signal causes both comparators to hold their output states. The comparators 410 and 412 can thus be used as low frequency sampling devices that indicate the state of VDUT at a particular point in time. By repeating a portion of test code and moving the time at which LE is activated, the signal at $V_{DUT}$ can be traced as a function of time.

To operate the detectors as digitizing devices, the preferred embodiment prescribes the use of software libraries for sampling I/O of the DUT. A user of the automatic test equipment can invoke the libraries for repetitively running specific portions of code found in the test program, i.e., it includes the same test patterns for exercising the DUT in the same way. As the tester runs the software from the library, it simultaneously samples the I/O of relevant pins of the DUT.

Figure 4B:
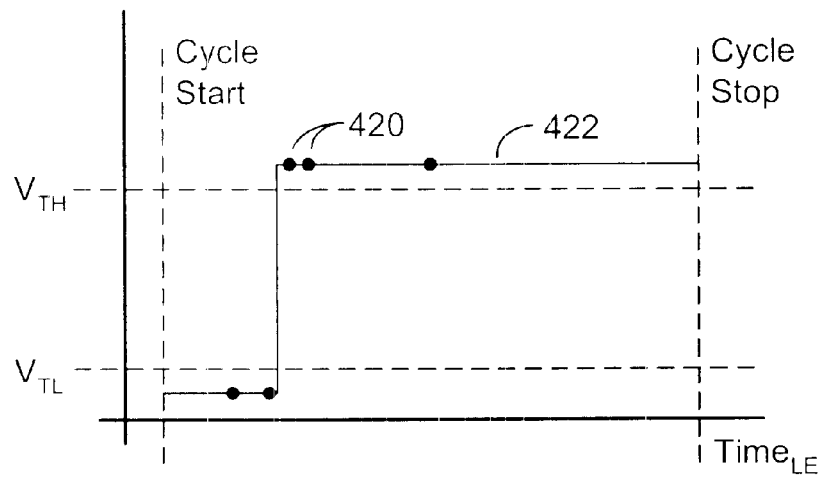
Figure 4C:
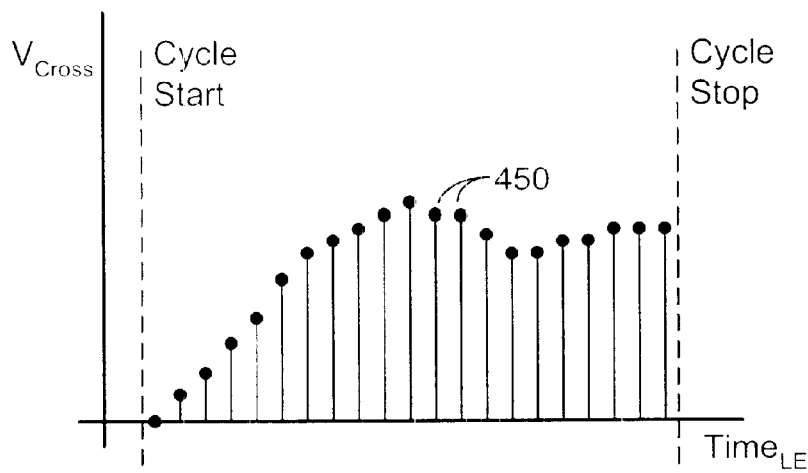

FIGS. 4B and 4C show two ways in which the detector circuit of FIG. 4A can be used for sampling signals from the device under test. FIG. 4B illustrates "edge" mode for sampling signals. According to edge mode, the software library controlling the sampling moves the LE signal through a test cycle in search of a logic state transition, known as an edge, in the signal being sampled. For each placement of the LE signal within a test cycle, the tester reruns the test code and the detector generates output that indicates whether the sample is HI, LO, or BETWEEN. Edge mode is intended to maximize the speed of locating an edge. Therefore, the library preferably employs a binary search algorithm for finding an edge. Only a small number of points 420 are required to converge upon the location of an edge. Once the edge is located, an idealized digital waveform 422 can be traced to represent the signal at the pin being sampled. If the signal is expected to include more than one edge, the library can alter its search method. For example, the library can control the placement of the LE signal to perform a linear sweep from the beginning of the test cycle to the end of the test cycle.

FIG. 4C illustrates "level" mode of sampling signals. Level mode accurately captures the voltage levels of the signal being sampled, in addition to the time at which edges occur. The additional information is obtained at the expense of speed. According to level mode, the software library advances the LE signal linearly from the beginning of a test cycle to the end of the test cycle. At each setting of the LE signal, the library repeats the test patterns and varies the detector's voltage levels, $V_{TH}$ and $V_{TL}$, to zero-in on the voltage level 450 of the sampled signal. The voltage of the sampled signal is found when the output of the detector changes state between two settings of the voltage levels. For speed, the software library preferably employs a binary search routine to find the voltage level of the sampled signal at each location of the LE signal.

In the preferred embodiment, the software library resides on the tester along with the test program and other tester software. The library includes features for looping on test patterns or groups of test patterns, and for collecting waveform information in either edge mode or level mode, at the user's selection. The library stores sampled data in the sampled collection 216, for subsequent comparison with the simulation baseline 214. Under user control, the library can direct the tester to sample all pins of the device under test for the entire test program, to sample only designated pins, or to sample any or all pins for designated test patterns only.

Because edge mode is relatively fast, users will generally employ edge mode to gather a complete record of a DUT's waveforms throughout the operation of the test program. Once the results of edge mode are inspected, users may wish to examine suspect portions of the test program or suspect pins using the more detailed sampling capabilities that level mode provides.

Integrated Environment

Figure 5:
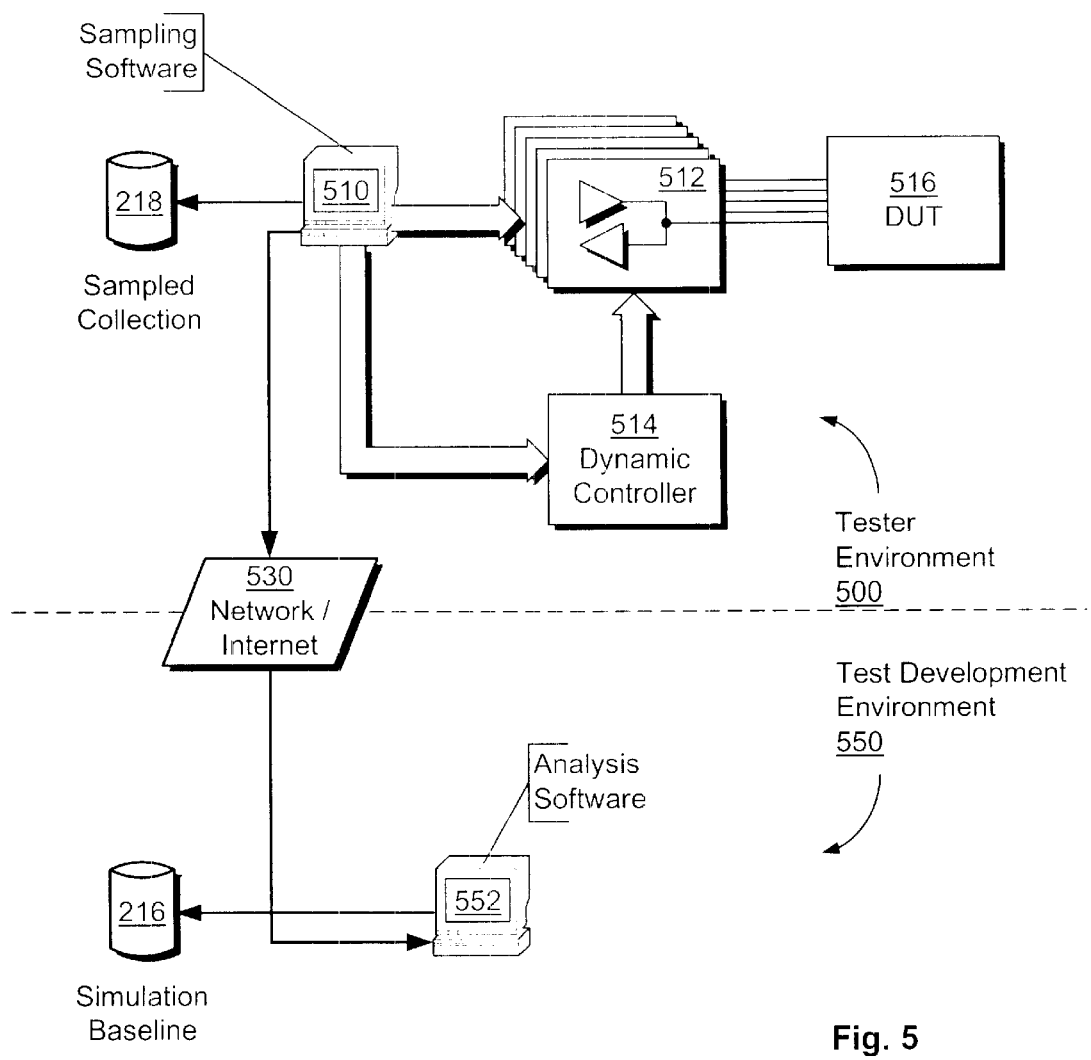
FIG. 5 is a simplified schematic of a system for troubleshooting a test program according to the invention using an automatic test system and a remote test development workstation.

Once the simulation baseline 214 and the sampled collection 216 have been generated, a user can view and directly compare simulated and actual waveforms to troubleshoot a test program or otherwise analyze the waveforms. FIG. 5 illustrates the preferred environment for troubleshooting test programs according to the invention.

An operator—generally a test development engineer—accesses a computer workstation 552 in a test development environment 550. The computer workstation 552 runs analysis software for displaying and analyzing waveforms. The computer workstation 552 has access to the simulation baseline 214 for displaying simulated waveforms. It also has access to the sampled collection 216, which was produced in a tester environment 500. Access may be accomplished in a variety of ways, such as by a computer network or internet 530, or by copying the files from the tester environment 500 to the test development environment 550 and archiving them locally.

With access established to both sources of data, the operator in the test development environment can run the analysis software for diagnosing problems with the test program. In the preferred embodiment, DataScope software is enhanced with a capability to display actual waveforms stored in the sampled collection 216 together with the simulated waveforms that it has traditionally been able to display. These enhanced features of DataScope are expected to be marketed under the name "Silicon Signals™."

Figure 6:
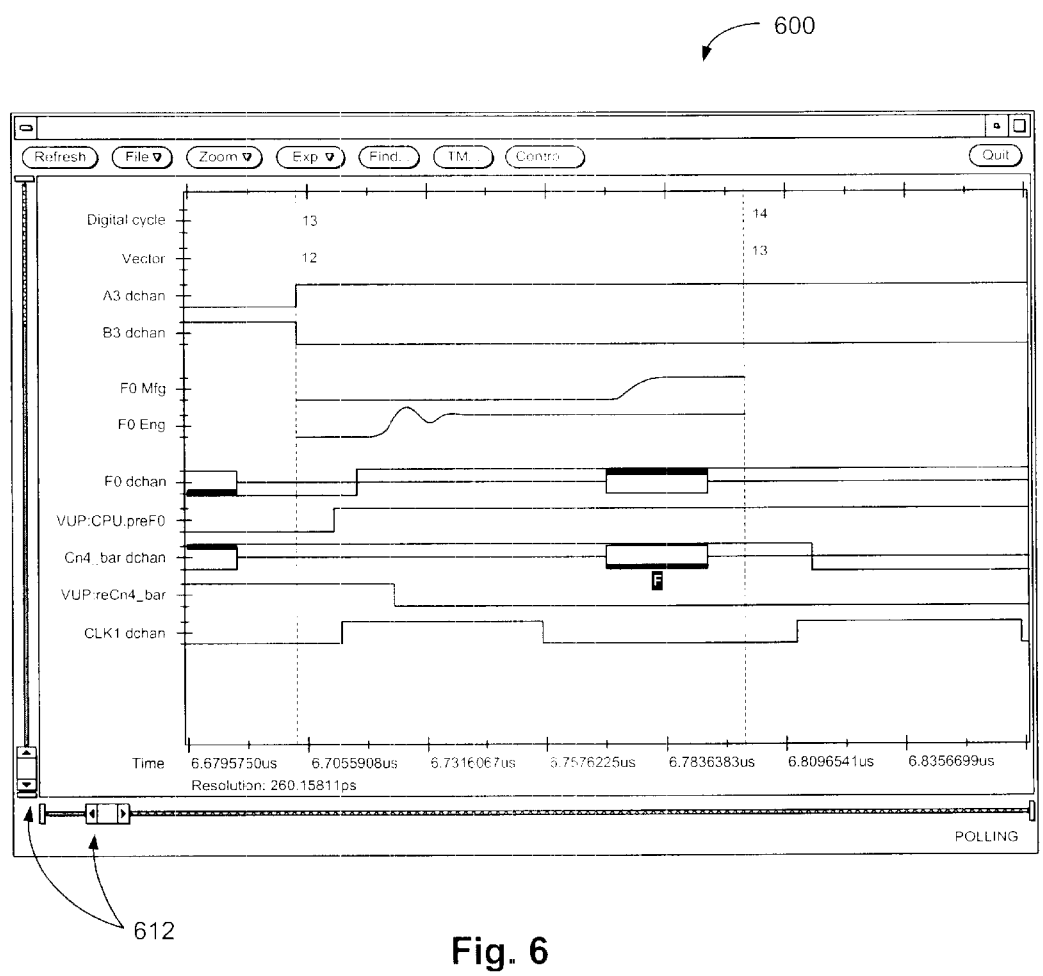
FIG. 6 depicts a screen shot for displaying both simulated waveforms of a device model and actual waveforms of a device acquired on an automatic test system in response to actual input signals, in accordance with the invention.

Within DataScope, data from the sampled collection 218 is aligned in time with data from the simulation, and both types of data are displayed on the same screen. FIG. 6 is a drawing of a typical DataScope screen 600 enhanced with Silicon Signals. An actual, time-aligned signal sampled from an actual device under test appears as the waveform "F0 Mfg." On the DataScope display, the operator can directly compare F0 Mfg with its simulation counterpart, "F0 dchan" to search for possible sources of test program failures. Differences between simulated and actual results may indict the test program, the simulation, or the device under test.

As with conventional DataScope, DataScope enhanced with Silicon Signals also provides the capability to display events occurring at different instants in time, to add or remove waveforms from the display, and to search for failures. One feature of Silicon Signals permits a user to scan through the data stored in the simulation baseline 214 and sampled collection 216 to identify instances in which they deviate from each other by more than a user-specified limit. Preferably, a user specifies a guardband that corresponds to a maximum allowable difference between actual and simulated waveforms. Instances in which the difference exceeds the guardband are flagged as suspect.

Another added feature permits a user to scan waveforms at times that precede the displayed time range, to find preceding events that may have contributed to a failure observed on a currently displayed screen. This feature greatly assists in identifying the root cause of test program failures, which generally can be traced to events that precede the actual failing tests.

Yet another added feature includes applying statistical methods for analyzing actual and simulated waveforms. For example, mean difference between corresponding edges of actual and simulated waveforms are computed and displayed, as well as maximum and minimum differences, and standard deviations. Portions of test code can be flagged as suspect if any of these statistical measures exceeds a predetermined limit.

Advantages

The technique disclosed herein confers numerous advantages over the currently used, often ad hoc, technique for troubleshooting test programs. The instant invention allows operators to visually compare simulated waveforms with waveforms acquired on an actual device under test. This gives the operator a window into events occurring on the test floor, even though the test floor may be located half-way around the world. The operator can use the tools provided to quickly diagnose problems and offer solutions. Tester downtime and uncertainty are greatly reduced. Expensive support missions under crisis conditions can be averted.

Alternatives

Having described one embodiment, numerous alternative embodiments or variations can be made. For example, the embodiment above describes comparing simulation data with actual waveform data for a single device under test. The comparison can be made for more than one device under test, however. FIG. 6 illustrates precisely this case. The waveform "F0 Mfg" corresponds to data acquired from one tester on the test floor using one DUT. However, the waveform labeled "F0 Eng" corresponds to data acquired using another DUT from another tester, one that is accessible to the test development engineer. The invention therefore allows simulation data to be compared with actual results from different testers or from different DUTs.

As indicated in FIG. 5, some portions of the techniques disclosed are preformed at the tester environment 500 and other portions are performed at the test development environment 550. This is not required, however. The analysis software can be loaded on the computer workstation 510 within the tester and the simulation baseline 216 can be made available to the tester environment 500. Thus, one can troubleshoot the test program entirely on the tester, if desired.

Although troubleshooting test programs is a primary application of the techniques described herein, the invention is not limited to this application. For example, test development engineers typically use actual testers to debug test programs before deploying them for production testing. According to another alternative, the analysis software can be loaded onto these testers for assisting the test development engineers in developing more robust test programs. The techniques disclosed herein can be used for debugging device simulations, by flagging instances in which actual results substantially differ from simulated results. In addition, device designers or other technical personnel can use the techniques disclosed for learning about the behavior of physical devices in actual operating environments. Thus, the invention can be used more generally for improving the flow of information among design facilities, test development facilities, and production testing facilities.

According to another variation, the test development engineer can control the tester via remote control software, to gather sampled waveform data directly. This capability further relieves the personnel at the testing facility from having to participate in solving the test program failure.

As described above, detector circuits are used to sample the pins of a DUT, for building the sampled collection 216. As testers continue to advance, more suitable devices may be used. For example, it is foreseeable that testers may someday include high-speed digitizers for every pin of a DUT. Therefore, the invention is not limited to situations in which waveforms are sampled using detectors like the one shown in FIG. 4A.

The techniques described above benefit from the use of simulation data that is derived by emulating the operation of the tester testing a simulated DUT with the actual test program. The invention is not limited to this type of simulation data, however. Simulations of the DUT alone—i.e., without tester emulation—may also be used. In addition, VX, DataScope, and Silicon Signals are disclosed as part of the preferred embodiment, but the invention is not limited to the use of these products.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. A computer-implemented system for analyzing the behavior of an electronic device, comprising:
    means for accessing data representing simulated waveforms of the electronic device in response to simulated test events;
    means for accessing data representing actual waveforms of the electronic device in response to actual test events, wherein the actual waveforms are sampled from an actual electronic device using an automatic test system and the actual test events correspond to physical manifestations of the simulated test events; and
    means for graphically displaying the data representing the simulated waveforms together with the data representing the actual waveforms for enabling a visual comparison of simulated and actual behavior of the electronic device in response to the simulated and actual test events.
    wherein the means for accessing data representing simulated waveforms is located remotely from the automatic test system.

2. The computer-implemented system as recited in claim 1, further comprising:
    means for aligning data representing simulated waveforms with data representing actual waveforms for enabling responses to corresponding simulated and actual test events to be visually compared.

3. The computer-implemented system as recited in claim 1,
    wherein the data representing actual waveforms includes data representing actual waveforms for a plurality of different physical devices; and
    wherein the means for graphically displaying includes means for displaying data representing actual waveforms of different ones of the plurality of different physical devices.

4. The computer-implemented system as recited in claim 1, further comprising means for computer processing the data representing simulated waveforms and the data representing actual waveforms to detect instances in which the simulated and actual waveforms differ by more than a predetermined limit.

5. The computer-implemented system as recited in claim 4, wherein the predetermined limit is user-programmable.

6. The computer-implemented system as recited in claim 1, further comprising:
    means for executing the actual test events on an automatic test system; and
    means for sampling at least one output of the electronic device during the execution of the actual test events.

7. The computer-implemented system as recited in claim 6, wherein the means for executing comprises a software program executable on the automatic test system for exercising the electronic device.

8. The computer-implemented system as recited in claim 6, wherein the means for executing comprises means for detecting the occurrence of an edge at a terminal of the electronic device.

9. The computer-implemented system as recited in claim 6, wherein the means for executing comprises means for sampling a signal at a terminal of the electronic device at a predetermined sampling rate.

10. An automatic test system for exercising an electronic device, comprising:
    sampling circuitry for sampling at least one actual waveform of the electronic device as it responds to at least one predetermined test event;
    software for accessing data representing the at least one actual waveform, and for accessing data representing at least one simulated waveform produced by a simulation of the electronic device as it responds to the at least one predetermined test event; and
    a display for displaying together the at least one actual waveform and the at least one simulated waveform, wherein the software program controls pin electronics circuitry for sampling a waveform at a predetermined sampling rate.

11. The automatic test system as recited in claim 10, further comprising:
    a software program for executing at least one predetermined test event on an automatic test system, wherein the software program is executable on the automatic test system for exercising the electronic device.

12. The automatic test system as recited in claim 10, wherein the software program controls pin electronics circuitry for detecting the occurrence of an edge in a sampled waveform.

13. The automatic test system as recited in claim 10, wherein the tester is used to test integrated circuits in a production environment.

14. A computer-implemented system for troubleshooting a test program directed at testing an electronic device on an automatic test system, comprising:
    tester emulation software for emulating the behavior of the automatic test system exercising the electronic device;
    software for storing simulation data acquired through operation of the tester emulation software, wherein the simulation data represents simulated waveforms of the electronic device in response to predetermined test events;
    software for accessing the simulation data and actual data representing actual waveforms sampled from an automatic test system exercising the electronic device; and
    software, operable in communication with the software for accessing, for graphically displaying together the simulated and actual waveforms and enabling a visual comparison between the simulated and actual waveforms in response to the predetermined test events,
    wherein the tester emulation software comprises:
        software for emulating the behavior of the automatic test system executing
        software for exercising the electronic device;
        software for enabling the software for emulating the automatic test system to communicate with the software for simulating the electronic device.

15. The computer-implemented system as recited in claim 14 wherein the software for emulating the automatic test system comprises:
    software for emulating digital test equipment;and
    software for emulating analog test equipment.

16. In a computer-implemented system, a graphical display to aid in analyzing the behavior of a device under test in an automatic test system, comprising:

at least one trace representing a simulated waveform of an input or output of a device under test;

at least one trace representing an actual waveform sampled from an automatic test system exercising the device under test; and a user control for initiating a scan of displayed waveforms for identifying an instance in which an actual waveform and a simulated waveform differ by more than a predetermined limit, wherein the at least one trace representing a simulated waveforms and the at least one trace representing an actual waveform represent corresponding test events spanning corresponding intervals of time.

17. The graphical display as recited in claim 16, wherein the device under test is a first device under test, and further comprising:

at least on trace representing an actual waveform sampled from an automatic test system exercising a second device under test.

18. The graphical display as recited in claim 16, further comprising a user control for changing a time span over which waveforms are displayed.

19. The graphical display as recited in claim 16, further comprising a user control for setting the predetermined limit.

20. The graphical display as recited in claim 16, wherein the graphical display is located remotely from the automatic test system.

21. A method of troubleshooting a test program that runs on an automatic test system for testing an electronic device, comprising:

emulating in software the automatic test system exercising the electronic device as it undergoes a predetermined test scenario;

storing emulated waveform data corresponding to at least one waveform of the electronic device as it undergoes the predetermined test scenario;

sampling at least one actual waveform of an actual electronic device being exercised on an actual automatic test system as it undergoes the predetermined test scenario;

storing, responsive to the step of sampling, actual waveform data; and displaying together the emulated waveform data and the actual waveform data to enable a visual comparison of the emulated and actual waveform data in response to the predetermined test event.

22. A method analyzing the behavior of an electronic device, comprising:

emulating in software an automatic test system exercising the electronic device as it undergoes a predetermined test scenario;

storing emulated waveform data corresponding to at least one waveform of the electronic device as it undergoes the predetermined test scenario;

sampling at least one actual waveform of an actual electronic device being exercised on an actual automatic test system as it undergoes the predetermined test scenario;

storing, responsive to the step of sampling, actual waveform data; and computer-processing the emulated waveform data and the actual waveform data to enable a comparison of the emulated and actual waveform data in response to the predetermined test event.

23. A method of developing a test program for testing an electronic device, comprising:

emulating in software the automatic test system exercising the electronic device as it undergoes a predetermined test scenario included in the test program;

storing emulated waveform data corresponding to at least one waveform of the electronic device as it undergoes the predetermined test scenario;

sampling at least one actual waveform of an actual electronic device being exercised on an actual automatic test system as it undergoes the predetermined test scenario;

storing, responsive to the step of sampling, actual waveform data; and displaying together the emulated waveform data and the actual waveform data to enable a visual comparison of the emulated and actual waveform data in response to the predetermined test event.

24. A computer-implemented system for analyzing the behavior of an electronic device, comprising:

data representing simulated waveforms of the electronic device in response to simulated test events;

data representing actual waveforms of the electronic device in response to actual test events, wherein the actual waveforms are sampled from an actual electronic device using an automatic test system and the actual test events correspond to physical manifestations of the simulated test events;

a graphical display for displaying the data representing the simulated waveforms together with the data representing the actual waveforms for enabling a visual comparison of simulated and actual behavior of the electronic device in response to the simulated and actual test events; and software for comparing the data representing the simulated waveforms with the data representing the actual waveforms to identify differences between them.

* * * * *